(12) United States Patent
Fong et al.

(10) Patent No.: US 6,762,706 B2
(45) Date of Patent: Jul. 13, 2004

(54) REDUCED POWER ANALOG-TO-DIGITAL CONVERTER AND METHOD THEREOF

(75) Inventors: Edison Fong, Sunnyvale, CA (US); Richard M. Ho, San Jose, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/171,005

(22) Filed: Jun. 12, 2002

(65) Prior Publication Data

US 2003/0231128 A1 Dec. 18, 2003

(51) Int. Cl.[7] ................................................. H03M 1/12
(52) U.S. Cl. ........................ 341/155; 341/167; 341/166; 341/161
(58) Field of Search ................................ 341/155, 144, 341/167, 161, 135, 166

(56) References Cited

U.S. PATENT DOCUMENTS

| | | | | |
|---|---|---|---|---|
| 4,746,900 A | * | 5/1988 | Shibuya et al. | 241/133 |
| 5,059,977 A | * | 10/1991 | Herman et al. | 341/144 |
| 5,612,698 A | * | 3/1997 | Reay | 341/167 |
| 5,640,163 A | * | 6/1997 | Nauta et al. | 341/155 |
| 5,719,578 A | * | 2/1998 | Bohme | 341/161 |
| 5,815,104 A | * | 9/1998 | Jackson et al. | 341/144 |
| 6,061,010 A | * | 5/2000 | Adams et al. | 341/144 |
| 6,150,967 A | * | 11/2000 | Nakamura | 341/135 |
| 6,211,583 B1 | * | 4/2001 | Humphreys | 307/131 |
| 6,243,034 B1 | * | 6/2001 | Regier | 341/166 |
| 6,545,623 B1 | * | 4/2003 | Yu | 341/155 |

OTHER PUBLICATIONS

Ping Wai Li et al., "A Ratio–Independent Algorithmic Analog–to–Digital Conversion Technique," IEEE Journal of Solid–State Circuits, vol. SC–19, No. 6, Dec. 1984, pp. 828–836.

Cheng–Chung Shih and Paul R. Gray, "Reference Refreshing Cyclic Analog–to–Digital and Digital–to–Analog Converters," IEEE Journal of Solid–State Circuits, vol. SC–21, No. 4, Aug. 1986, pp. 544–554.

Joseph M. Ingino and Bruce A. Wooley, "A Continuously Calibrated 12–b, 10–MS/s, 3.3–V A/D Converter," IEEE Journal of Solid–State Circuits, vol. 33, No. 12, Dec. 1998, pp. 1920–1931.

Gian Hoogzaad and Raf Roovers, "A 65–mW, 10–bit, 40–Msample/s BiCMOS Nyquist ADC In 0.8 mm2," IEEE Journal of Solid–State Circuits, vol. 34, No. 12, Dec. 1999, pp. 1796–1802.

Bernard Ginetti et al., "A CMOS 13–b Cyclic RSD A/D Converter," IEEE Journal of Solid–State Circuits, vol. 27, No. 7, Jul. 1992, pp. 957–965.

Stephen H. Lewis et al., "A 10–b 20–Msample/s Analog–to–Digital Converter," IEEE Journal of Solid–State Circuits, vol. 27, No. 3, Mar. 1992, pp.351–358.

Doug Garrity and Pat Rakers, "A 10 bit, 2Ms/s, 15mW BiCMOS Cyclic RSD A/D Converter," Motorola Semiconductor Products Sector White Paper, 4 pp. (No date).

* cited by examiner

*Primary Examiner*—Jean Bruner Jeanglaude
(74) *Attorney, Agent, or Firm*—Toler, Larson & Abel, LLP (57) ABSTRACT

A reduced power analog-to-digital (A/D) converter is disclosed herein. Reference current to an op-amp used in an A/D converter is reduced during later conversion cycles in an A/D conversion process. The reference current to the op-amp can be reduced without sacrificing overall accuracy of the output of the analog-to-digital converter, even though reducing the current to the op-amp reduces the accuracy of the op-amp. This is possible because the op-amp only needs to operate at maximum accuracy during the first conversion cycle, and can operate at reduced levels of accuracy during later conversion cycles.

42 Claims, 4 Drawing Sheets

REDUCED POWER ANALOG-TO-DIGITAL CONVERTER AND METHOD THEREOF

FIELD OF THE DISCLOSURE

This invention relates generally to analog-to-digital converters, and more particularly to reduced power analog-to-digital converters.

BACKGROUND

The accuracy of an analog-to-digital (A/D) converter is dependant in part on the accuracy of op-amps used in its construction. This is particularly true in cyclic A/D converters, because they use the same op-amp throughout the entire analog-to-digital conversion process. In order to ensure the required level of accuracy from the A/D converter, conventional cyclical A/D converters are designed to maintain the op-amp at the highest level of accuracy, usually better than one least-significant bit (LSB), during the entire analog-to-digital conversion process.

In general, when an op-amp is operated to achieve a high level of accuracy, a relatively large amount of power is consumed. Conversely, when relatively low accuracy is required of an op-amp, a lower amount of power is required. As a result, although operating the op-amp in an A/D converter at a high level of accuracy results in an accurate output from the A/D converter, the accuracy comes at the cost of high power consumption. This high power consumption can be problematic when A/D converters are used in limited-power applications, such as wireless phones and other portable devices. At the very least, a reduction in the power needed to operate the op-amp of an A/D converter could make more power available for use by other circuitry.

What is needed, therefore, is a way to decrease the amount of power used by an op-amp of an A/D converter, without sacrificing the overall accuracy of the A/D converter.

BRIEF DESCRIPTION OF THE DRAWINGS

Various objects, advantages, features and characteristics of the present disclosure, as well as methods, operation and functions of related elements of structure, and the combination of parts and economies of manufacture, will become apparent upon consideration of the following description and claims with reference to the accompanying drawings, all of which form a part of this specification.

DETAILED DESCRIPTION OF THE FIGURES

FIGS. 1 through 5 illustrate an A/D converter having reduced power requirements. In at least one embodiment, an A/D converter, according to the present invention, supplies a maximum amount of reference current to an op-amp in an analog to digital converter during a first clock cycle. During subsequent clock cycles the amount of reference current supplied to the op-amp is reduced. The amount of current supplied during each clock cycle is sufficient to ensure that the op-amp is operating at a required level of accuracy, and yet not using power unnecessarily by maintaining a maximum accuracy during all conversion cycles.

Figure 1:
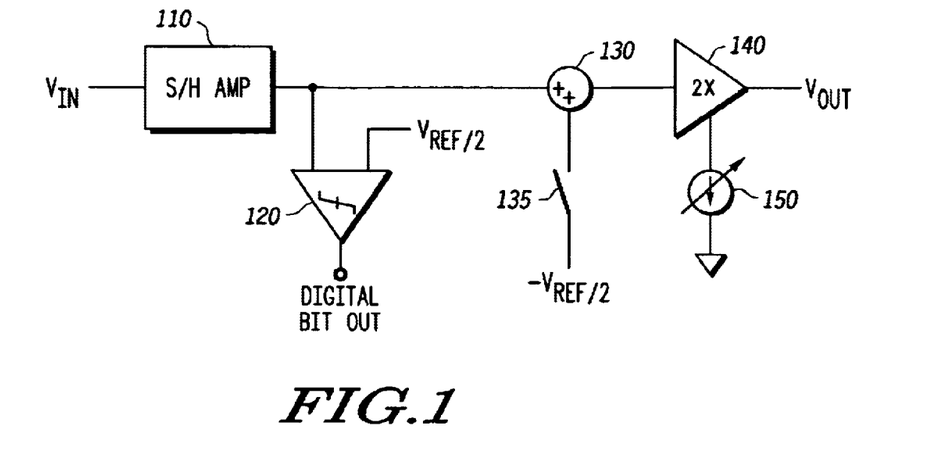
FIG. 1 is a schematic of a cyclical A/D converter according to an embodiment of the present invention.

Referring first to FIG. 1, a basic A/D converter according to at least one embodiment of the present invention will be discussed, and is referenced generally as A/D converter 100. In the illustrated embodiment, A/D converter 100 includes sample and hold amplifier 110, comparator 120, summing node 130, switch 135, op-amp 140 and variable current reference 150. An analog signal to be converted into digital format is received at Vin of sample and hold amplifier 110. Various sample and hold amplifiers 110 may be implemented by those skilled in the art.

Once the signal is sampled by sample and hold amplifier 110, it is compared in comparator 120 to a reference voltage, in this case Vref/2, and if the sampled signal is greater than the reference voltage the digital bit out of comparator 120 is set to one. If, however, the sampled signal is less than the reference voltage, then the digital bit out is set to zero. After comparing the sampled signal to the reference voltage, the sampled signal is then put through summing node 130 where, depending upon the value of the results of the comparison, one of two things happens: Vref/2 is subtracted from the signal, or the signal is passed unaltered to op-amp 140. If the value of the sampled signal Vin is greater than Vref/2, such that digital bit value of one was produced by comparator 120, then switch 130 is closed to connect summing node 130 to negative Vref/2 so that Vref/2 is subtracted from the sampled signal, if comparator 120 produced a zero, switch 135 remains open, so that Vref/2 is not subtracted from the sampled input signal.

After passing through summing node 130, the sampled signal goes to op-amp 140, which in the illustrated embodiment is a 2×amplifier. A/D converter 100 is a cyclical A/D converter, so the output of op-amp 140 is fed back to Vin to be compared again by comparator 120 for use in subsequent bit conversions. In at least one embodiment, an additional sample and hold amplifier (not shown) is used to sample Vout, and the sampled Vout is fed back to a point after sample and hold amplifier 110. It should become apparent, therefore, that it is necessary to subtract Vref/2 from the sampled signal when the sampled signal is greater than Vref/2 to prevent the clipping of the output from op-amp 140.

During the first bit-conversion cycle of the A/D converter, which is when the most significant bit of the output is generated, variable current reference 150 supplies a maximum amount of current to op-amp 140 so that op-amp 140 operates at a maximum required accuracy. In at least one embodiment, the maximum amount of current is successively reduced for less significant bits. The maximum required accuracy of op-amp 140 is determined, at least in part, by the desired accuracy of A/D converter 100. Note that the accuracy of op-amp 140 generally depends on, among other things, the amount of current supplied by variable current reference 150, where greater accuracy generally requires a greater amount of reference current. The current supplied by variable current reference 150 during the later portions of the A/D conversion cycle, when less accuracy is needed, will generally be less than the amount of current supplied during early portions of the conversion cycle.

During the first clock cycle, op-amp 140 multiplies the sampled signal to an accuracy of at least one LSB. One LSB expresses accuracy in relative terms, and the accuracy associated with one LSB depends upon a total number of bits to be converted by A/D converter 100. For example, an op-amp in a ten bit A/D converter requires much greater accuracy than an op-amp used in a one bit analog-to-digital converter, even though both op-amps may be operating at an accuracy of one LSB.

The relationship between the desired accuracy and the number of bits of an A/D converter can be understood by comparing a one-bit A/D converter with a 10 bit A/D converter. Assume, for purposes of this example, that the voltage of a signal to be converted is less than or equal to a 10 volt reference signal. In the one-bit A/D converter, only a single comparison would be performed by comparator 120, such that if the sampled voltage was greater than half of ten, for example six, then a the A/D converter would produce an output bit of one, while if the sampled voltage was less than half of ten, for example four, the A/D converter would generate an output bit of zero. It should be apparent that the one-bit converter provides a resolution of only plus or minus one-half of the least significant bit, or 5 volts.

Consider now a more accurate A/D converter with ten-bits of resolution. The ten-bit A/D converter, like the one bit A/D converter, is accurate to half an LSB, but in this case the A/D converter is accurate to within 0.01 volts. As should be apparent from this example, the accuracy of op-amp 140 is much more critical when used in an A/D converter having 10 bits of resolution than in an A/D converter having fewer bits of resolution.

Since A/D converter 100 is a cyclical A/D converter, the output of op-amp 140 will be used as an input in all bit calculations after the first. Because of this feedback, any error in the multiplication performed by op-amp 140 will carry through to all the later bits, and could affect the accuracy of A/D converter 100. As a result, the first multiplication performed by op-amp 140 requires the greatest accuracy. Similarly, although perhaps not immediately apparent, the accuracy of any multiplications performed by op-amp 140 become less important during later portions of the conversion process. To understand this concept, consider that after the first clock cycle of a 10-bit A/D conversion, there are only nine more conversion cycles to be performed. Therefore, during the second portion of a 10-bit conversion, op-amp 140 need only be accurate enough to perform a nine-bit conversion. Similarly, op-amp 140 need only be accurate enough to perform an 8-bit conversion during the third portion of a 10-bit conversion, a 7-bit conversion during the fourth portion, and so on. This continues, until during the last portion of the A/D conversion, op-amp 140 only needs to be accurate enough to support a one-bit conversion.

Since the accuracy of op-amp 140 can be controlled by varying the amount of reference current supplied by variable current reference 150, and since op-amp 140 has decreasing accuracy needs as the A/D conversion progresses from the first cycle to the last, variable current reference 150 may supply a decreasing amount of reference current during later conversion cycles without sacrificing the overall accuracy of A/D converter 100. A major advantage of being able to reduce the reference current supplied to op-amp 140, is that substantial power savings may be achieved. For example, assume again a ten-bit A/D converter. If the reference current supplied by variable current reference 150 is periodically decreased by 20% every other cycle of conversion, a power savings of about 50% can be realized throughout the entire conversion process. As another example, the reference current can be reduced every third clock cycle for a power savings of about 30% to 35%. This power savings can be significant, especially in today's portable devices.

Figure 2:
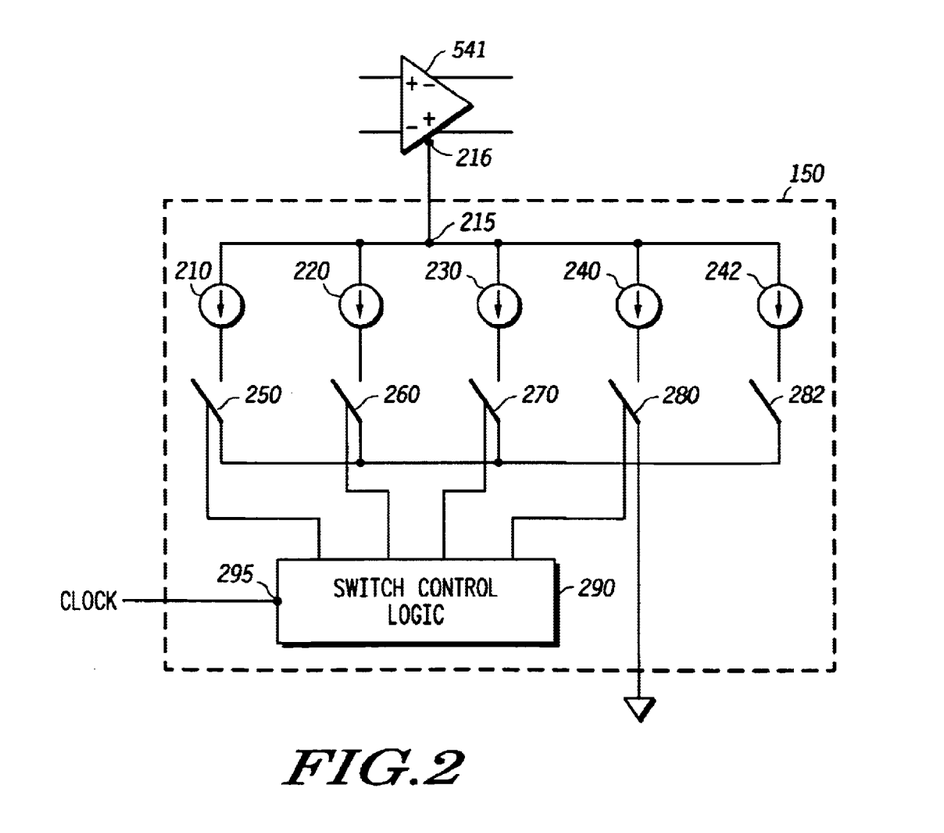
FIG. 2 is a schematic illustrating a reference current control circuit for an op-amp in an A/D converter according to an embodiment of the present invention.

In the illustrated embodiment of FIG. 2, a variable current reference 150 is shown connected to a differential version op-amp 140 (FIG. 1), designated as differential op-amp 541, and provides a decreasing amount of reference current during successive conversion cycles. Variable current reference 150 includes a clock input 295 to receive a system clock for timing purposes; switch control logic 290 to control a series of switches 250, 260, 270, 280 and 282; and a series of current sources 210, 220, 230, 240, and 242 to provide varying amount of current through output 215 to bias reference 216 of differential op-amp 541. Assume that differential op-amp 541 and variable current reference 150 are being used in a ten-bit A/D converter, similar to A/D converter 100 (FIG. 1). Assume, furthermore, that it is desired to reduce the amount of current supplied to differential op-amp 541 by variable current reference 150 every other clock cycle.

During a first clock cycle, switch control logic 290 would close switch 282 so that differential op-amp 541 was connected to current source 242, which provides 100% of the current necessary to allow differential op-amp 541 to operate efficiently enough to support a ten-bit A/D conversion. During the next clock cycle switch 282 remains closed. During the third clock cycle, however, switch control logic 290 opens switch 282 and closes switch 280 so that differential op-amp 541 is connected to current source 240, which provides approximately 20% less current than that supplied by current source 242. In this way, on the third clock cycle of the conversion, the accuracy of differential op-amp 541 is decreased to match the accuracy necessary for that stage of the conversion. By reducing, the amount of current used by the A/D converter a corresponding reduction of power consumption by A/D converter 100 (FIG. 1) is achieved. In the illustrated embodiment, every other clock cycle switch control logic 290 opens the switch that is currently closed and then closes the next switch in sequence such that switches 282, 280, 270, 260 and 250 are each closed in sequence. Since each successive switch connects a lower value current supply to bias reference 216 of differential op-amp 541, the accuracy and power consumption of differential op-amp 541 are periodically decreased during successive conversion/clock cycles.

In at least one embodiment current source 242 supplies one unit of current, current source 240 supplies 0.8 units of current, current source 230 supplies 0.6 units of current, current source 220 supplies 0.4 units of current, and current source 210 supplies 0.2 units of current. In yet another embodiment, the sum of the current provided by current sources 210, 220, 230, 240 and 242 totals one unit of current, and switches 250, 260, 270, 280 and 282 are used to disconnect appropriate current sources from output 215 every other clock cycle, thereby reducing the total amount of current supplied to bias reference 216 of differential op-amp 541 during later portions of an A/D conversion cycle.

It will be appreciated that although a ten-bit A/D converter with current reduction every other clock cycle is discussed in FIG. 2, other patterns of reducing the reference current to differential op-amp 541 can be employed without departing from the spirit and scope of the present invention. For example, the amount by which successive current sources differ from each other need not be approximately 20%, but may instead be some other value based upon various design parameters. For example, when implementing an eight-bit A/D converter, it may be desirable to reduce the amount of reference current by 25% every other clock cycle. Alternatively, it may be desirable to reduce the amount of reference current supplied by variable current reference 150 by 10% every clock cycle rather than by 20% every other clock cycle. It will also be appreciated that while separate current sources 210, 220, 230, 240 and 242 are illustrated in FIG. 2, a single variable reference source may be employed. Switch control logic 290 can be implemented in software, in hardware, in firmware, or by any other suitable method known to those skilled in the art for implementing control logic for controlling switches.

Figure 3:
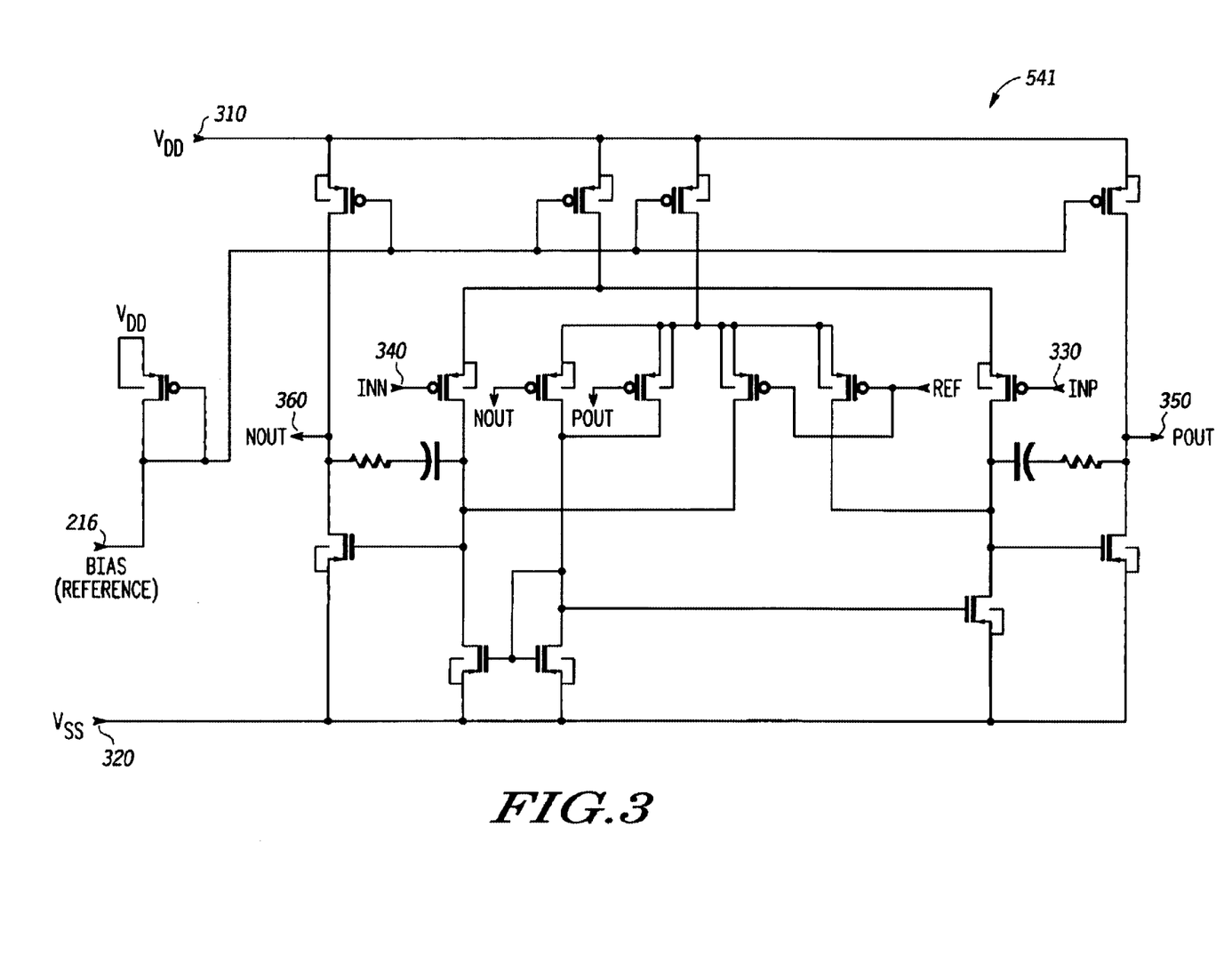
FIG. 3 is a schematic of an op-amp configured to accept a single reference current source according to an embodiment of the present invention.

Referring next to FIG. 3, a fully differential version of op-amp 140 (FIG. 1), designated as differential op-amp 541, will be discussed according to an embodiment of the present invention. It will be appreciated that while lower resolution A/D converters may be implemented without employing a fully differential op-amp, to achieve the desired level of accuracy necessary for use in ten-bit A/D converters, a fully differential version of op-amp 140 (FIG. 1), such as differential op-amp 541, should be employed. In addition to being a fully differential op-amp, differential op-amp 541 can be configured such that a reference current supplied through bias reference 216 is the only bias current needed to properly operate differential op-amp 541. FIG. 3 illustrates a fully differential op-amp circuit with such a single bias reference 216. As with other op-amps, differential op-amp 541 includes positive voltage input VDDA 310, negative voltage input VSSA 320, positive signal input 330, negative signal input 340, positive signal output 350 and negative signal output 360. The manner in which these inputs can be connected to implement a cyclic A/D converter according to one embodiment of the present invention will be discussed with reference to FIG. 4

Figure 4:
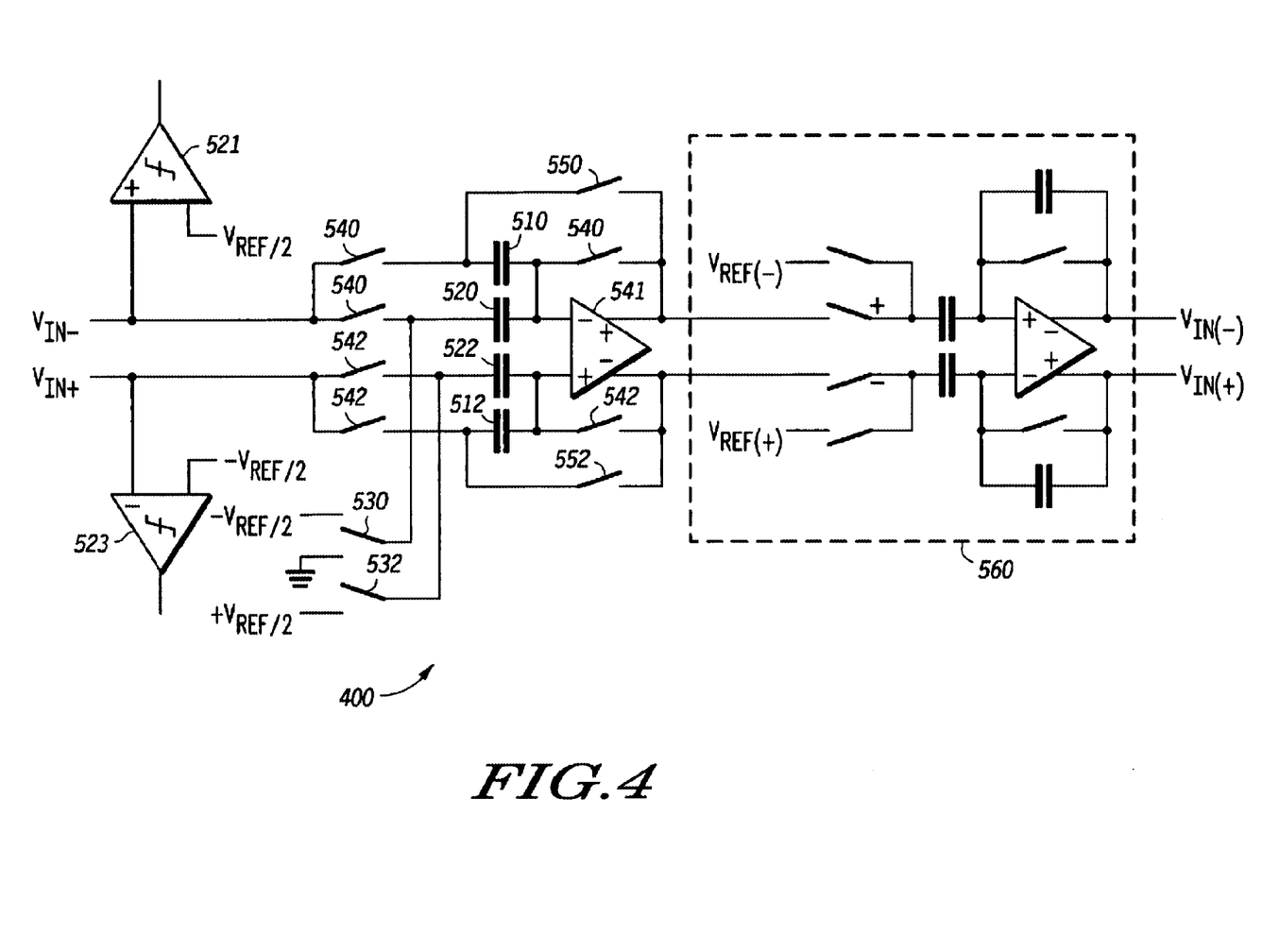
FIG. 4 is a schematic illustrating a fully differential op-amp using in an A/D converter according to one embodiment of the present invention.

Referring now to FIG. 4, differential op-amp 541 is shown in cyclical A/D converter 400 according to one embodiment of the present invention. For ease of discussion, only one side of the differential A/D converter 400 will be discussed. It will be apparent to those skilled in the art that the description of the functions of one side of the differential op-amp 541 can simply be mirrored for the second side.

The function of A/D converter 400 illustrated in FIG. 4, is essentially as follows. First, an analog signal is sampled and held by a differential sample-and-hold circuit (not shown). Comparators 521 and 523 then compare the sampled voltage to a reference voltage and generate either a one or zero depending upon the results of that comparison. A capacitor and switch network, in combination with differential op-amp 541, effectively subtracts Vref/2 when necessary, and at the same time multiplies the resulting signal by two. The output of differential op-amp 541 is fed into sample-and-hold circuit 560, which is a fully differential sample-and-hold circuit, and the outputs of the sample-and-hold circuit 560 are then fed back to Vin– and Vin+ to be compared by comparators 521 and 523 during subsequent clock cycles.

We will now proceed to discuss the capacitor and switch networks connected to the negative input of differential op-amp 541, keeping in mind that the operation of the capacitors and switches on the positive input of differential op-amp 541 operate analogously. Switches 540, 550 and 530 are, in one embodiment, controlled by two non-overlapping phase clocks. The non-overlapping phase clocks are advantageous in minimizing leakage and feed-through, since a clock feed-through of even 500 micro volts will compromise a ten-bit A/D converter's performance. During the first clock phase, switches 540 are closed thereby storing Vin onto capacitors 510 and 520. At this point, differential op-amp 541 is in the unity gain configuration. Capacitor 520 also stores the offset of differential op-amp 541 on its right plate, thereby providing auto zeroing. During the time when switches 540 are closed, comparator 521 also determines whether the input voltage is greater or less than Vref/2.

During the next phase, switches 540 open and switch 550 closes. Additionally, switch 530 will be connected either to negative Vref/2 or ground depending on the results of the comparison performed by comparator 521. Since capacitor 510, and in particular the right plate of capacitor 510 is charged with a voltage equal to Vin, when switch 550 closes, the positive output of differential op-amp 541 will quickly settle at the voltage Vin. Since the left plate of C1 was also charged with Vin during the first phase when switches 540 were closed, if the left plate of capacitor 520 is grounded there is a net change across capacitor 520 of Vin–. This effectively results in a Vin+ at the inverting input to differential op-amp 541. Since the differential op-amp 541 is now in the inverting configuration, the Vin+ at the inverting input to differential op-amp 541 adds a Vin+ to the output, which when added to the Vin+ already at the output due to the charge on capacitor 510 results in a final sum of 2Vin. In this way, the 2 times multiplication is performed. If a subtraction of the Vref/2 needs to occur, then rather than switching to ground, switch 530 switches to—Vref/2.

In implementing a circuit similar to that shown in FIG. 4, careful layout of the capacitors is used to avoid errors propagating to subsequent conversion cycles. Ideally, the capacitors should be surrounded with dummies, and a centroid layout may be necessary. In addition, those skilled in the art will realize upon consideration of the discussion herein that the capacitors should be matched to exceed the bit resolution by at least two-bits.

Figure 5:
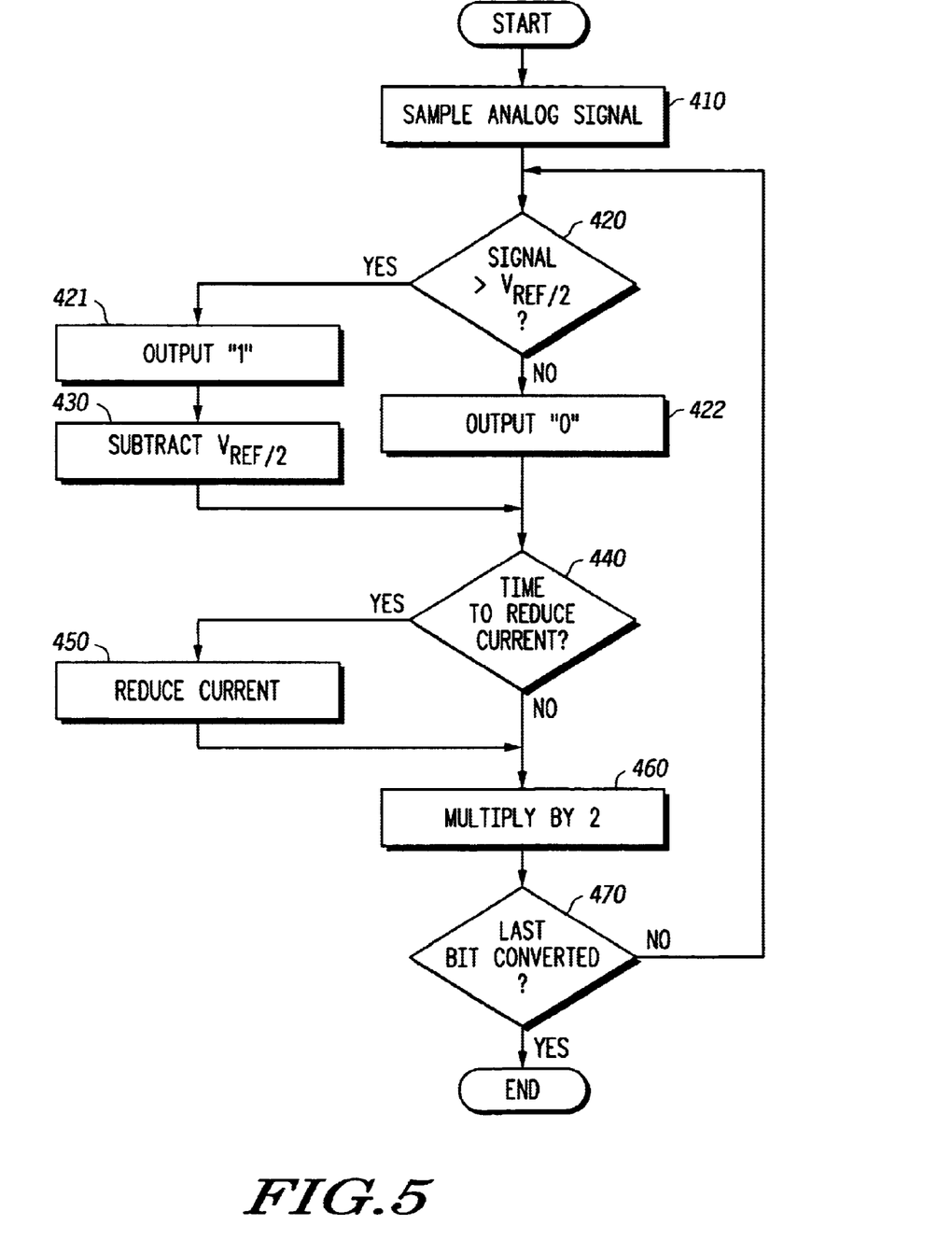
FIG. 5 is a flow chart illustrating a method of reducing the current used by an op-amp according to an embodiment of the present invention.

Referring next to FIG. 5 a method of performing an A/D conversion according to an embodiment of the present invention will be discussed. The A/D conversion begins when the analog signal is sampled in step 410. The method proceeds to step 420 where the signal is compared to Vref/2. If the signal is greater than Vref/2 the method proceeds to step 421 where a digital one is output and then on to step 430 where Vref/2 is subtracted. If, however, the sampled signal is determined to be less than Vref/2 in step 420, the A/D converter will output a digital zero in step 422, and then proceed to step 440.

Step 440 determines whether the current should be reduced in the amplifier being used in the A/D converter. Whether or not the current should be reduced is a function of the number of clock cycles in at least one embodiment. For example, in an implementation of the present disclosure in which the current is to be reduced every other clock cycle, if only one clock cycle has occurred since the last time the current was reduced, the result of step 440 will be NO. However, if it is the second clock cycle since the current has been reduced, then the result of step 440 will be YES. If the result of step 440 is YES, the current will be reduced in step 450. The reduction of the reference current to op-amp 140 has been previously discussed with reference to FIG. 2. After the current is reduced in step 450 or immediately after step 440 if the result of step 440 is NO, the method proceeds to step 460 in which the sampled analog signal, or the sampled analog signal minus Vref/2, is multiplied by two. The multiplication of the signal by two has been previously discussed with reference to FIGS. 1 through 4.

After the signal has been multiplied in step 460, the method proceeds to step 470, which determines whether or not more bits need to be converted. If all bits have been converted, the method proceeds to end. However, if all necessary conversions have not been performed, the method returns to step 420, and the next conversion cycle is performed.

In summary, it should be apparent from a review of the foregoing disclosure that various advantages can be achieved by employing an A/D converter as taught herein. Reducing unnecessary accuracy in the op-amp by decreasing the reference current supplied to the op-amp can conserve power without sacrificing accuracy in the A/D converter's output. Since less power is used, an A/D converter according to at least one embodiment of the present invention offers a superior option when used in conjunction with products having a critical power consumption parameter.

In the preceding detailed description of the figures, reference has been made to the accompanying drawings which form a part thereof, and in which is shown by way of illustrations specific embodiments in which the invention may be practiced. These embodiments are described in sufficient detail to enable those skilled in the art to practice the invention, and it should be understood that other embodiments may be utilized and that logical, mechanical, chemical and electrical changes may be made without departing from the spirit or scope of the invention. For example, in the preceding description of various embodiments of the invention, reference was made to comparing a sampled analog signal to Vref/2. Vref/2 is used for conceptual ease, and to facilitate description of the various embodiment. Other embodiments of the present invention employ a comparison voltage of Vref/3, or Vref/4, depending on various design considerations such as the type of algorithm used in conjunction with the A/D converter. For example, redundant sign digit algorithms, which may use comparison voltages of Vref/3, Vref/4 and the like, may be used in conjunction with various embodiments of the present invention to take advantage of various error correction properties of the algorithm.

To avoid detail not necessary to enable those skilled in the art to practice the invention, the description may omit certain information known to those skilled in the art. Furthermore, many other varied embodiments that incorporate the teaching of the invention may be easily constructed by those skilled in the art upon consideration of the teachings set forth herein. According, the present disclosure is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present disclosure is defined only by the appended claims.

What is claimed is:

1. A method comprising the steps of:
   supplying a first amount of bias reference current to an op-amp used in an A/D converter; and
   decreasing the amount of bias reference current supplied to the op-amp after a period of time.

2. The method as in claim 1, wherein the period of time is a predetermined number of clock cycles of the A/D converter.

3. The method as in claim 2, wherein the predetermined number of clock cycles is 2 clock cycles.

4. The method as in claim 2, wherein the predetermined number of clock cycles is 3 clock cycles.

5. The method as in claim 1, wherein the step of decreasing the amount of bias reference current is performed a number of times dependent on a resolution of the A/D converter.

6. The method as in claim 5, wherein the amount of bias reference current is decreased 4 times when the resolution of the A/D converter is 10 bits.

7. The method as in claim 5, wherein the step of decreasing the amount of bias reference current is performed every other clock cycle of the A/D converter.

8. The method as in claim 5, wherein the step of decreasing the amount of bias reference current is performed every third clock cycle of the A/D converter.

9. The method as in claim 1, wherein after a period of time, the amount of bias reference current is decreased to about 20 percent of the first amount of reference current.

10. The method as in claim 1, wherein the amount of bias reference current is decreased by an amount dependent on a resolution of the A/D converter and the period of time.

11. The method as in claim 1, wherein the A/D converter is a cyclical A/D converter.

12. The method as in claim 11, wherein the A/D converter is a Redundant Sign Digit A/D converter.

13. A analog-to-digital (A/D) converter comprising:
    an op-amp having a bias reference input to receive a current-reference; and
    a variable-current reference having a reference output coupled to said input of said op-amp to supply a varying amount of bias reference current.

14. The A/D converter as in claim 13, wherein said variable-current reference further includes:
    a clock input to receive a clock signal;
    a plurality of switches; and
    control logic to control said plurality of switches to couple a plurality of different amounts of bias reference current to said reference output during different clock cycles.

15. The A/D converter as in claim 13, wherein:
    said variable-current reference provides a maximum amount of bias reference current during a first clock cycle of the A/D converter; and
    said variable-current reference provides a reduced amount of bias reference current during selected subsequent clock cycles of the A/D converter.

16. The A/D converter as in claim 15, wherein the reduced amounts of bias reference current are less than previous amounts of bias reference current by a predetermined amount.

17. The A/D converter as in claim 16, wherein the predetermined amount is based on a resolution of said A/D converter and a time between the selected subsequent clock cycles.

18. The A/D converter as in claim 16, wherein the reduced amounts of bias reference current are about 20 percent less than preceding amounts of bias reference current.

19. The A/D converter as in claim 15, wherein the selected subsequent clock cycles are a predetermined number of clock cycles apart.

20. The A/D converter as in claim 19, wherein the selected subsequent clock cycles are 2 clock cycles apart.

21. The A/D converter as in claim 19, wherein the selected subsequent clock cycles are 3 clock cycles apart.

22. The A/D converter as in claim 13, wherein said op-amp operates at a higher level of accuracy when said variable-current reference supplies a greater amount of bias reference current.

23. The A/D converter as in claim 13, wherein said A/D converter is a cyclical A/D converter.

24. The A/D converter as in claim 13, wherein said A/D converter is a Redundant Sign Digit A/D converter.

25. A method for use in a cyclical analog-to-digital (A/D) converter, the method comprising the steps of:

supplying, during a first clock cycle of the A/D converter, a predetermined amount of bias reference current to an op-amp, wherein the predetermined amount of bias reference current represents a maximum amount of current to be supplied; and supplying reduced amounts of bias reference current, relative to the predetermined amount, during selected subsequent clock cycles of the A/D converter.

26. The method as in claim 25, wherein the predetermined amount of bias reference current is reduced a number of times dependent on a resolution of the A/D converter.

27. The method as in claim 25, wherein the predetermined amount of bias reference current is reduced 4 times when the resolution of the A/D converter is 10 bits.

28. The method as in claim 25, wherein the step of supplying reduced amounts of bias reference current is performed periodically.

29. The method as in claim 28, wherein the period is every other clock cycle of the A/D converter.

30. The method as in claim 28, wherein the period is every third clock cycle of the A/D converter.

31. The method as in claim 25, wherein a least amount of bias reference current is about 20 percent of the predetermined amount of bias reference current.

32. The method as in claim 25, wherein the converter is a Redundant Sign Digit A/D converter.

33. A method for use in an A/D converter, the method comprising the steps of:

receiving an analog signal to be converted to a digital signal;

supplying a first amount of bias current to an op-amp of the analog-to-digital converter during conversion of a most significant bit; and supplying a reduced amount of bias current to the op-amp during conversion of a less significant bit.

34. The method as in claim 33, further including the step of supplying a successively reduced amount of bias current to a plurality of successively less significant bits.

35. The method as in claim 33, wherein the reduced amount of bias current is about 20 percent less than the first amount of bias current.

36. The method as in claim 33, wherein the step of supplying a reduced amount of bias current is performed after a predetermined number of clock cycles.

37. The method as in claim 33, wherein the reduced amount of bias current is determined at least in part by a resolution of the A/D converter and the period of time.

38. The method as in claim 33, wherein the A/D converter is a cyclical A/D converter.

39. The method as in claim 38, wherein the A/D converter is a Redundant Sign Digit A/D converter.

40. The method as in claim 1, wherein said op-amp operates at a higher level of accuracy when a greater amount of bias reference current is supplied.

41. The method as recited in claim 25, wherein the A/D converter operates at a higher level of accuracy when a greater amount of bias reference current is supplied.

42. The method as in claim 33, wherein the op-amp operates at a higher level of accuracy when a greater amount of bias current is supplied.

* * * * *

UNITED STATES PATENT AND TRADEMARK OFFICE
CERTIFICATE OF CORRECTION

PATENT NO. : 6,762,706 B2
DATED : July 13, 2004
INVENTOR(S) : Edison Fong et al.

It is certified that error appears in the above-identified patent and that said Letters Patent is hereby corrected as shown below:

Column 10,
Line 27, please add -- A/D -- between the words "wherein the" and "converter is"

Signed and Sealed this

Sixteenth Day of November, 2004

JON W. DUDAS
*Director of the United States Patent and Trademark Office*